US009734887B1

(12) United States Patent
Tavva

(10) Patent No.: US 9,734,887 B1
(45) Date of Patent: Aug. 15, 2017

(54) PER-DIE BASED MEMORY REFRESH CONTROL BASED ON A MASTER CONTROLLER

(71) Applicant: International Business Machines Corporation, Armonk, NY (US)

(72) Inventor: Venkata K. Tavva, Telangana (IN)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/075,230

(22) Filed: Mar. 21, 2016

(51) Int. Cl.
*G11C 11/406* (2006.01)

(52) U.S. Cl.
CPC .................... *G11C 11/406* (2013.01)

(58) Field of Classification Search
CPC ...................................... G11C 11/406
USPC ................................. 365/201, 222
See application file for complete search history.

(56) References Cited

U.S. PATENT DOCUMENTS

| 7,500,078 | B2 | 3/2009 | Rangarajan et al. |
| 8,060,774 | B2 | 11/2011 | Smith et al. |
| 8,200,999 | B2 | 6/2012 | Huizenga et al. |
| 8,566,516 | B2 | 10/2013 | Schakel et al. |
| 8,797,818 | B2* | 8/2014 | Jeddeloh ............... G11C 11/406 365/201 |
| 2013/0275665 | A1 | 10/2013 | Saraswat et al. |
| 2014/0140156 | A1* | 5/2014 | Shoemaker ............... G11C 7/04 365/201 |
| 2014/0281311 | A1* | 9/2014 | Walker .................. G06F 3/0631 711/162 |

OTHER PUBLICATIONS

J. Lim et al., "3D Stacked DRAM Refresh Management with Guaranteed Data Reliability," IEEE Transactions on Computer-Aided Design of Integrated Circuits and Systems, vol. 34, No. 9, 2015, pp. 1455-1466.
J. Liu et al., "RAIDR: Retention-aware intelligent DRAM refresh," 39th Annual International Symposium on Computer Architecture (ISCA), 2012, 12 pages.
M. Sadri et al., "Energy optimization in 3D MPSoCs with wide-I/O DRAM using temperature variation aware bank-wise refresh," Proceedings of the Conference on Design, Automatin & Test in Europe, Paper No. 281, 2014, 4 pages.

* cited by examiner

*Primary Examiner* — Hoai V Ho
*Assistant Examiner* — Minh Dinh
(74) *Attorney, Agent, or Firm* — Cantor Colburn LLP

(57) ABSTRACT

An aspect includes reading a plurality of sensor values from a plurality of sensors located on a plurality of memory dies in the HMC. It is determined that one of the plurality of sensor values from a sensor located on one of the plurality of memory dies has exceeded a threshold value. Based on the determining and on the one of the plurality of sensor values, calculating a refresh rate for the memory locations on the one of the plurality of memory dies. The vault controller is reconfigured to apply the calculated die refresh rate to the memory locations in the vault that are located on the one of the plurality of memory dies. The calculated die refresh rate is different than an other refresh rate being applied to memory locations in the vault that are located on an other one of the plurality of memory dies.

20 Claims, 3 Drawing Sheets

US 9,734,887 B1

PER-DIE BASED MEMORY REFRESH CONTROL BASED ON A MASTER CONTROLLER

BACKGROUND

The present invention relates to computer memory systems, and more specifically, to per-die based memory refresh control based on a master controller.

The phrase "memory wall problem" is used to refer to the growing disparity of speed between contemporary computer processors and computer memory located outside of the computer processors. Hybrid memory cube (HMC) technology targets the memory wall problem by stacking several dynamic random access memory (DRAM) dies over a logic die. In a HMC, memory modules are placed as stacked integrated circuits (or dies) in cubes, as opposed to being placed flat next to each other on a motherboard. In contemporary implementations of HMC, the number of stacked memory dies can be either four or eight, and all of the dies (memory and logic) are interconnected using Through Silicon Vias (TSVs). HMCs generally provide higher bandwidth, and consume less energy and area when compared to the conventional double data rate (DDR) memory modules.

Within a HMC, the memory is divided into multiple vaults. Each vault is completely independent in that it conducts its functions and operations independently of the other vaults. Each vault contains its own memory controller that manages all of the memory operations with the vault by adhering to the timing constraints. Refresh operations for memory locations within the vault are issued by the memory controller in the vault.

SUMMARY

Embodiments include a method, system, and computer program product for per-die based memory refresh control in a hybrid memory cube (HMC). A method includes reading a plurality of sensor values from a plurality of sensors located on a plurality of memory dies in the HMC. Each of the plurality of sensors is located on one of the plurality of memory dies. The HMC includes a memory vault with memory locations that span the plurality of memory dies. The HMC also includes a vault controller that is configured to apply a common refresh rate to all of the memory locations in the vault. It is determined that one of the plurality of sensor values from a sensor located on one of the plurality of memory dies has exceeded a threshold value. Based on the determining and on the one of the plurality of sensor values, calculating a die refresh rate for the memory locations on the one of the plurality of memory dies. The vault controller is reconfigured to apply the calculated die refresh rate to the memory locations in the vault that are located on the one of the plurality of memory dies. The calculated die refresh rate is different than an other refresh rate being applied to memory locations in the vault that are located on an other one of the plurality of memory dies.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
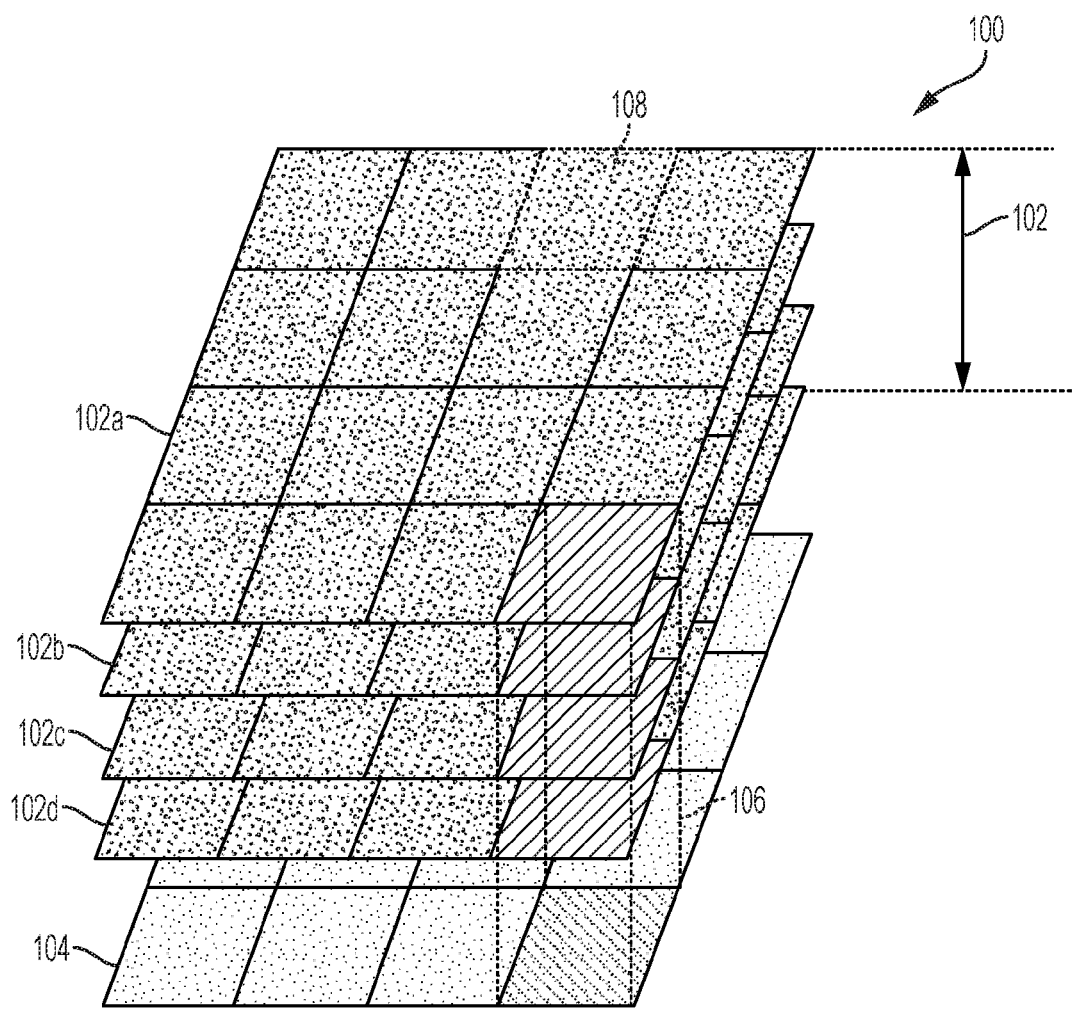
FIG. 1 is a block diagram of an exemplary hybrid memory cube (HMC) structure according to one or more embodiments.

Embodiments described herein are directed to efficient thermal management of hybrid memory cubes (HMCs). The memory in a contemporary HMC is divided into multiple vaults that span multiple dynamic random access memory (DRAM) dies. Each vault is completely independent in that it can conduct its own functions including the issuing of refresh operations. Memory controllers for each of the vaults, referred to herein as "vault controllers", in an HMC are located on a logic die in the HMC. Due to the high activity on the logic die, there is often a variation in the temperature across the DRAM dies in an HMC. The DRAM dies closer to the logic die can be hotter when compared to the DRAM dies that are farther away from the logic die. In general, cell retention time depends on the ambient temperature, and DRAM dies that are at a higher temperature require refresh operations to be performed more frequently than DRAM dies that are at a lower temperature. During refresh, the DRAM bank containing memory locations being refreshed is unavailable to service data requests.

To protect against data loss, contemporary memory systems set a per-vault refresh rate that is high enough to account for the hottest DRAM die in the HMC. Thus, in contemporary HMCs, even if only one memory die in the HMC is at a high temperature, all of the dies in the HMC are refreshed by a vault controller at the rate required by the die exhibiting the high temperature. This higher rate of refresh can lead to performance degradation and/or throttling.

Embodiments described herein implement a different approach and instead of setting a refresh rate to account for the hottest DRAM die in a vault, embodiments provide for controlling and varying the refresh rate on a per-die basis. In accordance with embodiments described herein, different DRAM dies within a vault can have different refresh rates.

In embodiments described herein, refresh operations in a HMC can be performed on a per-die basis. In embodiments, temperature sensors are located on one or more dies in the HMC. The HMC can be initialized with a default setting where vault controllers apply a common refresh rate to all of the memory locations within a vault that spans multiple dies. The sensor data (also referred to herein as "sensor values") can be read periodically and if a sensor value exceeds a first programmable threshold, a master controller (located, for example on the logic die of the HMC) can initiate per-die refresh operations by calculating the refresh rate of dies in the HMC separately based on their current temperatures. The master controller can disable the vault controller and perform the per-die refresh operations or the master controller can cause the vault controller to perform the per-die refresh operations. In embodiments, per-die refresh operations are initiated in response to an interrupt signal that is triggered when a sensor value exceeds a specified threshold value. Embodiments described herein provide for die refresh rates that are tailored to ambient temperatures of each die in an HMC.

Turning now to FIG. 1, a block diagram of an exemplary hybrid memory cube (HMC) structure is generally shown in accordance with an embodiment. The HMC 100 shown in FIG. 1 has multiple layers of integrated circuits, or dies that include a logic die 104 and four memory dies 102. The memory dies 102 are described herein as being implemented by DRAM dies, however other types of memory dies can also be implemented by embodiments such as, but not limited to: embedded DRAM (eDRAM) and static RAM (SRAM). In addition, the HMC 100 shown in FIG. 1 has four memory dies, however embodiments can be implemented with HMCs having a different number of memory dies, such as but not limited to eight or two can also be implemented. In an embodiment, the HMC 100 includes a plurality of memory vaults that can be operated independently of other memory vaults on the HMC 100. As shown in FIG. 1, the memory vault 106 includes a partition 108 on logic die 104, as well as partitions 108 on memory dies 102a, 102b, 102c, and 102d (collectively referred to herein as memory dies 102). Each vault 106 includes a vault controller, located for example on the logic die 104. Each vault 106 also includes memory cells at memory locations on the memory dies 102. Each vault controller can operate independently of the other vault controllers to read sensors and to perform refresh operations for memory locations within a vault 106.

Along with operating the DRAM layers, the logic die 104 can also perform other operations such as, but not limited to, power management for the HMC 100. In embodiments, the logic die 104 also includes a master controller for determining when the HMC 100 should operate in per-die memory refresh mode. The master controller can also initiate and disable per-die memory refresh in the HMC 100.

Figure 2:
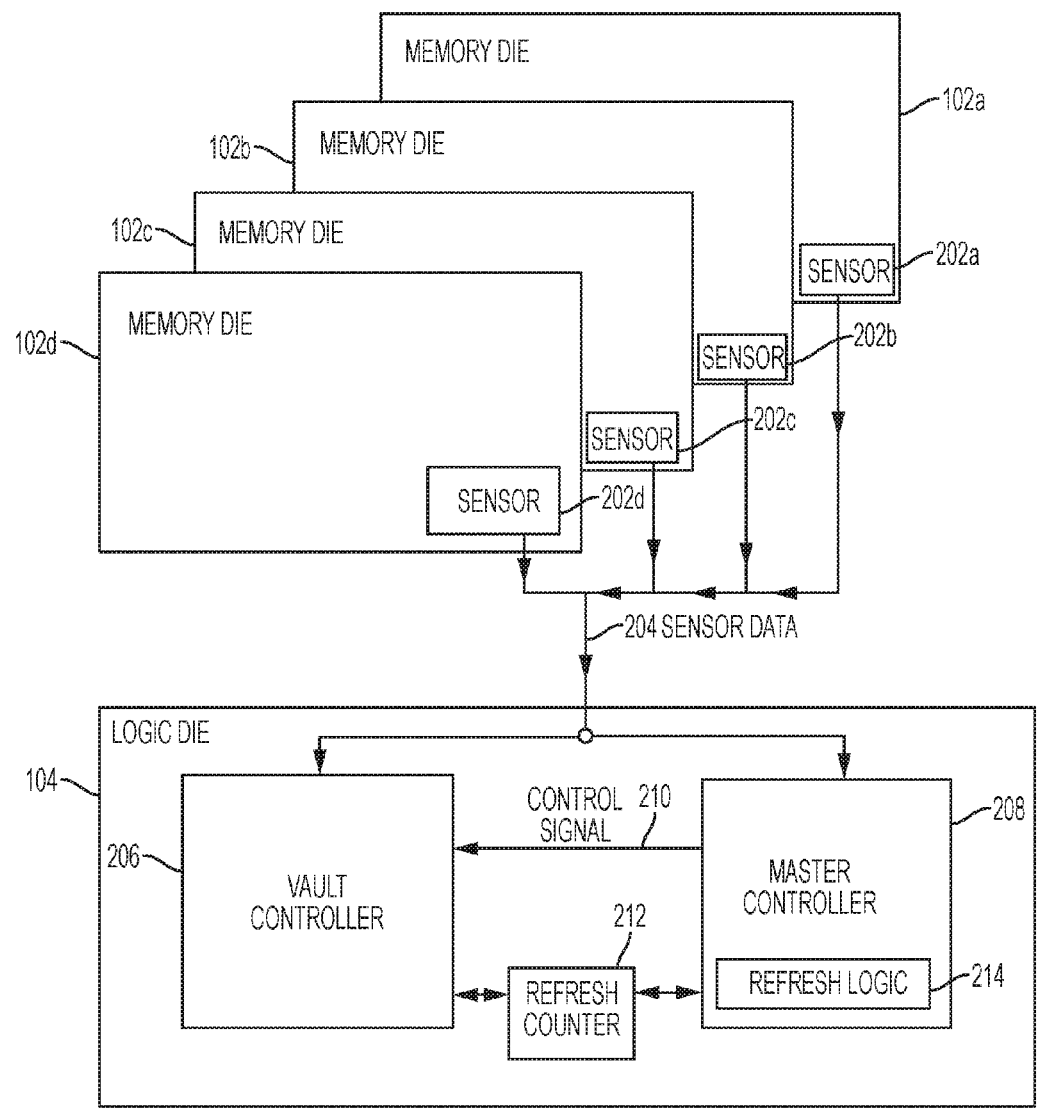
FIG. 2 is a block diagram of a logic die and memory dies in a HMC according to one or more embodiments.

Turning now to FIG. 2, a block diagram of a logic die 104 and memory dies 102 in an HMC is generally shown in accordance with one or more embodiments. The memory dies 102 in the vault shown in FIG. 2 include sensors 202a-202d (referred to collectively herein as sensors 202) which produce sensor data 204. Embodiments are not limited to a single sensor 202 on each memory die 102 as shown in FIG. 2, as any number of sensors (including no sensor) can be located on each memory die 102. As shown in the embodiment in FIG. 2, the sensor data 204 is input to both a vault controller 206 and a master controller 208 located on the logic die 104. Though just one vault controller 206 is shown in FIG. 2, embodiments can include a separate vault controller 206 for each vault in the HMC. In an embodiment, the vault controller 206 processes the sensor data 204 to determine a common, per-vault refresh rate for memory locations that span multiple memory dies 102 within the vault. In another embodiment, the master controller 208 processes the sensor data 204 to determine a common, per-vault refresh rate for memory locations that span multiple memory dies 102 within the vault.

The memory locations being refreshed are tracked using a refresh counter 212. In embodiments there is one refresh counter 212 for each memory die 102 in each vault to track a current location of refresh operations. Thus, the vault shown in FIG. 2 utilizes four refresh counters 212, one for each of the memory dies 102. In an embodiment, the refresh counters 212 are accessible by both the vault controller 206 and the master controller 208. The master controller 208 can have access to all of the refresh counters 212 for all of the vaults in the HMC.

The master controller 208 shown in FIG. 2 can send a control signal 210 to the vault controller 206. The control signal 210 is used to reconfigure the vault controller 206 to implement a per-die refresh rate when, for example, one or more of the temperature values from temperature sensors located on a memory die 102 exceeds a first programmable threshold value. In embodiments, the reconfiguring includes overriding the per-vault refresh rate and causing the vault controller 206 to apply a per-die refresh rate to the memory dies 102a-102d using a refresh rate for each die that is determined by refresh logic 214 in the master controller 208. In accordance with an embodiment, given that each DRAM array can be refreshed at a different rate, the refresh controller in each vault is configured to allow row activations and pre-charges are per array, to the banks in the array.

In alternative embodiments, the reconfiguring includes disabling the refresh operations being performed by the vault controller 206 and enabling the master controller 208 to perform the refresh operations for the HMC. In accordance with an embodiment, the master controller 208 can supply the starting row number (using its address counter) to each of the vault controllers 206 so that all the vaults controllers 206 can refresh the same rows across the DRAM array.

In embodiments, there may only be one refresh counter 212 for each vault that is used by the vault controller 206 for performing refreshes at a per-vault refresh rate, and one refresh counter 212 for each memory die 102 that is used by the master controller 208 for performing refreshes at a per-die refresh rate.

In embodiments, the vault controller 206 and/or master controller 208 read the sensor data to obtain sensor values on a periodic basis. In other embodiments, the sensors 202 are programmed to send alerts to the vault controller 206 and/or master controller 208 in response to the sensor value reaching programmable thresholds, such as exceeding the first programmable threshold value and falling below the second programmable threshold value. In further embodiments, a combination of the two approaches is implemented with sensor values being obtained on a periodic basis and alerts generated when threshold values are reached.

Figure 3:
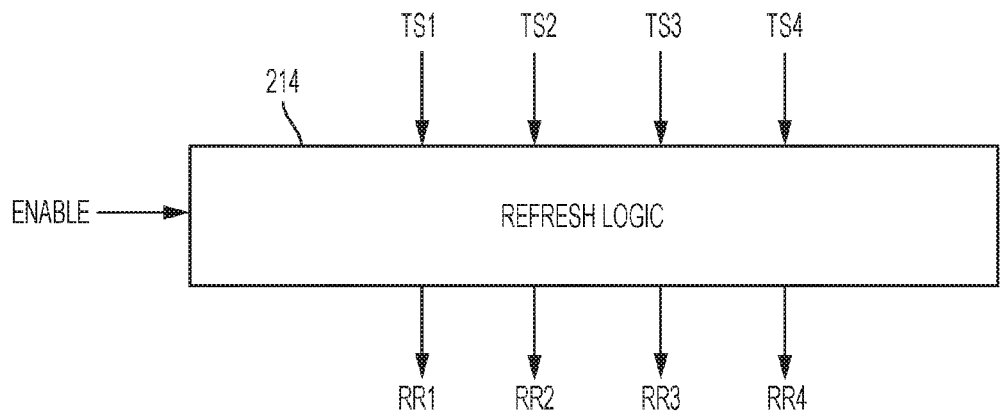
FIG. 3 is a block diagram of interfaces to refresh logic in a master controller according to one or more embodiments.

Turning now to FIG. 3, a block diagram of interfaces to refresh logic 214 in a master controller is generally shown according to one or more embodiments. As shown in FIG. 3, the refresh logic 214 on the master controller 208 is enabled, based for example, on an enable signal received during HMC initialization and/or an enable signal received from a processor or memory controller while the HMC is in operation. As shown in FIG. 3, inputs to the refresh logic 214 in the master controller 208 include temperature sensor data from each of the temperature sensors, labeled TS1, TS2, TS3, and TS4. Outputs from the refresh logic 214 in the master controller 208 include refresh rates for each of the memory dies 102, labeled RR1, RR2, RR3, and RR4. In embodiments, the die refresh rates (RR1, RR2, RR3 and RR4) are calculated by the refresh logic 214 and sent to all of the vault controllers 206, and the vault controllers 206 perform refreshes on a per-die basis at the specified refresh rates.

Figure 4:
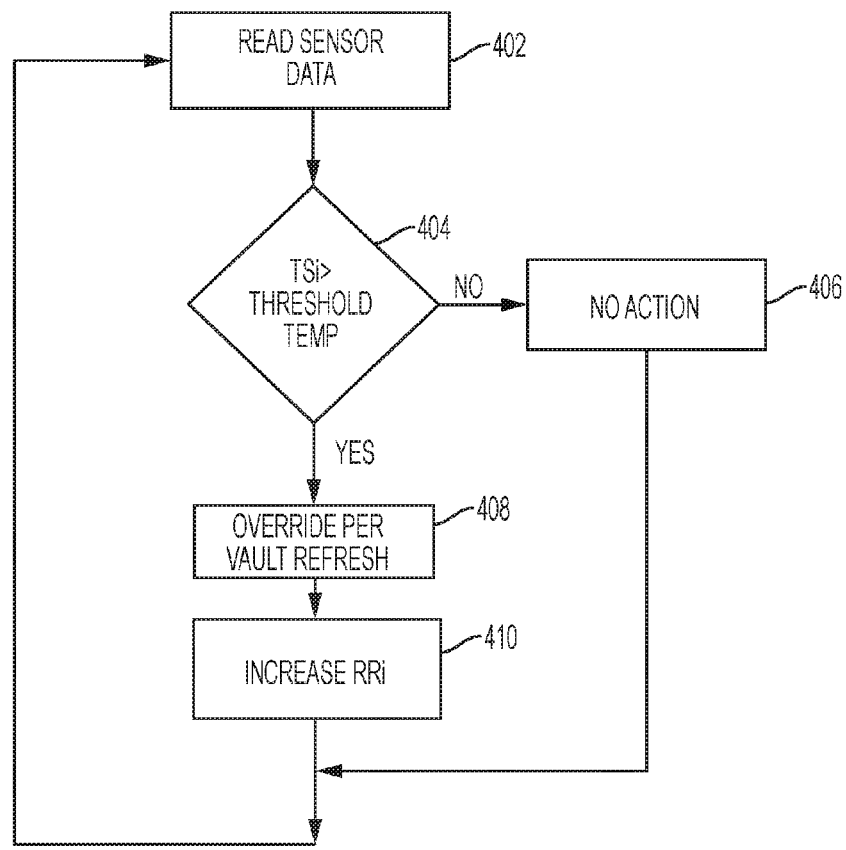
FIG. 4 is a process flow of refresh logic in a master controller according to one or more embodiments.

Turning now to FIG. 4, a process flow of refresh logic 214 in a master controller 208 is generally shown according to one or more embodiments. At block 402, sensor data 204 is read from sensors 202 located on the memory dies 102 in the HMC. In an embodiment, the HMC includes a memory vault with memory locations that span two or more of the memory dies 102, as well as a vault controller 206 that is configured to apply a common refresh rate to all of the memory locations in the vault (i.e., a per-vault refresh). At block 404, the refresh logic 214 determines whether a sensor value has exceeded a first threshold value. Based on determining, at block 404, that none of the sensor values has exceeded the first threshold value, no action is taken at block 406 and processing continues at block 402 where sensor data is read (e.g., on a periodic basis). Based on determining, at block 404, that at least one of the sensor values has exceeded the first threshold value, block 408 is performed to override the per-vault refresh. The refresh logic 214 calculates a new refresh rate for the memory locations on the die where the sensor value exceeding the first threshold value is located. At block 410, the refresh rate is increased by reconfiguring the vault controller 206 to apply the calculated die refresh rate to the memory locations in the vault that are located on the memory die. In an embodiment the calculated die refresh rate is different than a refresh rate being applied to memory locations in the vault that are located on a different memory die.

Technical effects and benefits include decreasing the frequency of refresh operations, which can lead to higher availability of the HMC to service data requests. Decreasing the number of refreshes can also lead to power savings.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method of per-die based memory refresh control in a hybrid memory cube (HMC) of a computer system, the method comprising:
   reading a plurality of sensor values from a plurality of sensors located on a plurality of memory dies in the HMC, each of the plurality of sensors located on one of the plurality of memory dies, the HMC comprising a memory vault that includes memory locations that span the plurality of memory dies and a vault controller that is configured to apply a common refresh rate to all of the memory locations in the vault;
   determining that one of the plurality of sensor values from a sensor located on one of the plurality of memory dies has exceeded a threshold value;
   based on the determining and on the one of the plurality of sensor values, calculating a die refresh rate for the memory locations on the one of the plurality of memory dies; and
   reconfiguring the vault controller to apply the calculated die refresh rate to the memory locations in the vault that are located on the one of the plurality of memory dies, wherein the calculated die refresh rate is different than an other refresh rate being applied to memory locations in the vault that are located on an other one of the plurality of memory dies.

2. The method of claim 1, wherein the sensor is a temperature sensor.

3. The method of claim 1, wherein the HMC comprises at least one additional memory vault comprising at least one additional vault controller and the reconfiguring further includes reconfiguring the at least one additional vault controller to apply the calculated die refresh rate to memory locations in the at least one additional memory vault that are located on the one of the plurality of memory dies.

4. The method of claim 1, wherein the calculated die refresh rate is applied by the vault controller to the memory locations in the vault that are located on the one of the plurality of memory dies.

5. The method of claim 1, wherein the calculated die refresh rate is applied by a master controller in the HMC to the memory locations in the vault that are located on the one of the plurality of memory dies.

6. The method of claim 1, further comprising receiving, at the HMC, a per die refresh rate enable signal, wherein the reconfiguring is responsive to the determining and to the receiving.

7. The method of claim 1, wherein there are multiple sensors located on at least one of the plurality of memory dies.

8. A memory system comprising:
   a hybrid memory cube (HMC), the memory system configured to perform:
   reading a plurality of sensor values from a plurality of sensors located on a plurality of memory dies in the HMC, each of the plurality of sensors located on one of the plurality of memory dies, the HMC comprising a memory vault that includes memory locations that span the plurality of memory dies and a vault controller that is configured to apply a common refresh rate to all of the memory locations in the vault;
   determining that one of the plurality of sensor values from a sensor located on one of the plurality of memory dies has exceeded a threshold value;
   based on the determining and on the one of the plurality of sensor values, calculating a die refresh rate for the memory locations on the one of the plurality of memory dies; and
   reconfiguring the vault controller to apply the calculated die refresh rate to the memory locations in the vault that are located on the one of the plurality of memory dies, wherein the calculated die refresh rate is different than an other refresh rate being applied to memory locations in the vault that are located on an other one of the plurality of memory dies.

9. The memory system of claim 8, wherein the sensor is a temperature sensor.

10. The memory system of claim 8, wherein the HMC comprises at least one additional memory vault comprising at least one additional vault controller and the reconfiguring further includes reconfiguring the at least one additional vault controller to apply the calculated die refresh rate to memory locations in the at least one additional memory vault that are located on the one of the plurality of memory dies.

11. The memory system of claim 8, wherein the calculated die refresh rate is applied by the value controller to the memory locations in the vault that are located on the one of the plurality of memory dies.

12. The memory system of claim 8, wherein the calculated die refresh rate is applied by a master controller in the HMC to the memory locations in the vault that are located on the one of the plurality of memory dies.

13. The memory system of claim 8, wherein the memory system is further configured to perform receiving, at the HMC, a per die refresh rate enable signal, wherein the reconfiguring is responsive to the determining and to the receiving.

14. The memory system of claim 8, wherein there are multiple sensors located on at least one of the plurality of memory dies.

15. A computer program product for per-die based memory refresh control in a hybrid memory cube (HMC), the computer program product comprising a computer readable storage medium having program instructions embodied therewith, the program instructions executable by processing circuitry to cause the processing circuitry to:
read a plurality of sensor values from a plurality of sensors located on a plurality of memory dies in the HMC, each of the plurality of sensors located on one of the plurality of memory dies, the HMC comprising a memory vault that includes memory locations that span the plurality of memory dies and a vault controller that is configured to apply a common refresh rate to all of the memory locations in the vault;
determine that one of the plurality of sensor values from a sensor located on one of the plurality of memory dies has exceeded a threshold value;
based on the determining and on the one of the plurality of sensor values, calculate a die refresh rate for the memory locations on the one of the plurality of memory dies; and
reconfigure the vault controller to apply the calculated die refresh rate to the memory locations in the vault that are located on the one of the plurality of memory dies, wherein the calculated die refresh rate is different than an other refresh rate being applied to memory locations in the vault that are located on an other one of the plurality of memory dies.

16. The computer program product of claim 15, wherein the sensor is a temperature sensor.

17. The computer program product of claim 15, wherein the HMC comprises at least one additional memory vault comprising at least one additional vault controller and the reconfiguring further includes reconfiguring the at least one additional vault controller to apply the calculated die refresh rate to memory locations in the at least one additional memory vault that are located on the one of the plurality of memory dies.

18. The computer program product of claim 15, wherein the calculated die refresh rate is applied by the value controller to the memory locations in the vault that are located on the one of the plurality of memory dies.

19. The computer program product of claim 15, wherein the calculated die refresh rate is applied by a master controller in the HMC to the memory locations in the vault that are located on the one of the plurality of memory dies.

20. The computer program product of claim 15, wherein the program instructions are further executable by the processing circuitry to cause the processing circuitry to receive, at the HMC, a per die refresh rate enable signal, wherein the reconfiguring is responsive to the determining and to the receiving.

* * * * *